United States Patent [19]

Bellman

[11] Patent Number: 4,521,893

[45] Date of Patent: Jun. 4, 1985

[54] CLOCK DISTRIBUTION CIRCUIT FOR ACTIVE APERTURE ANTENNA ARRAY

[75] Inventor: Brian M. Bellman, Severna Park, Md.

[73] Assignee: The Unites States of America as represented by the Secretary of the Air Force, Washington, D.C.

[21] Appl. No.: 487,340

[22] Filed: Apr. 21, 1983

[51] Int. Cl.$^{3}$ .......... H03B 21/01

[52] U.S. Cl. .......... 375/107; 343/372; 331/60

[58] Field of Search .......... 343/368, 369, 371, 372; 375/107; 455/51, 71; 331/2, 18, 60, 46, 37

[56] References Cited

U.S. PATENT DOCUMENTS

| | | | |
|---|---|---|---|
| 1,490,958 | 4/1924 | Bown | 455/51 |
| 3,128,465 | 4/1964 | Brilliant | 343/225 |
| 3,230,453 | 1/1966 | Boor et al. | 455/71 |
| 3,289,084 | 11/1966 | Adams | 455/71 |
| 3,745,361 | 7/1973 | Boyd et al. | 307/3 |
| 3,792,478 | 2/1974 | Parquier et al. | 343/100 SA |
| 3,806,947 | 4/1974 | Krall et al. | 343/854 |
| 3,829,790 | 8/1974 | Macrander | 331/61 |
| 3,832,713 | 8/1974 | Rubin | 343/371 |
| 3,999,182 | 12/1976 | Moeller et al. | 343/372 |
| 4,245,326 | 1/1981 | Gutleber | 343/378 |
| 4,247,817 | 1/1981 | Heller | 324/73 R |
| 4,337,433 | 6/1982 | Yoshimura | 328/55 |

*Primary Examiner*—Benedict V. Safourek

*Attorney, Agent, or Firm*—Donald J. Singer; Richard J. Donahue

[57] ABSTRACT

A system for communicating a time reference or clock signal to a plurality of processors over substantial distances where propagation time between units is significant compared to the processing time. The timing signal is in the form of two continuous sinusoidal waves of different frequency but equal amplitude, which are added to give equal contributions in the resultant composite, two frequency, sum signal. The resulting waveform has sharply defined nulls occurring at the difference frequency which are used as a precise time reference.

6 Claims, 2 Drawing Figures

CLOCK DISTRIBUTION CIRCUIT FOR ACTIVE APERTURE ANTENNA ARRAY

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to signal distribution systems and more particularly to apparatus for distributing a time reference clock to all of the individual processors in an active aperture antenna array.

When digital processors are distributed over substantial distances, such that propagation time between elements is significant compared to processing time, then precise synchronization of all processing elements is required to assure their correct interaction. The path over which the synchronizing signals are broadcast must be carefully designed and the waveforms utilized should be selected to obtain the desired accuracy. In addition to operating all elements precisely in synchronism, there are sometimes special circumstances when the time reference must be precisely varied from element to element, for example to compensate for differential delays in signal paths. Such requirements are believed to be common to many applications where distributed processing is a characteristic.

One application which illustrates the magnitude and importance of the problem, is the active aperture antenna array. This array can comprise many thousands of individual radiating/receiving elements spaced over surfaces typically of a few hundred square feet. At each radiating element, a processor controls the phase of the RF signal to steer the antenna beam. The beam can be made extremely agile as the controlling processors are capable of switching in a few nanoseconds. With this agility, time sharing of the antenna to perform varied functions (such as multiple target tracking or communications) and ultra rapid scanning required in the bistatic radar pulse chasing mode, are possible. The beam steering mechanism is typically digitally based, and the transient condition between pointing in one direction and then moving to another direction, introduces disturbances which need to be minimized. These transients are particularly serious during bistatic pulse chasing where scan rates of the order of degrees per microsecond are possible. In this mode, signals are received while scanning by a step/dwell sequence. To minimize the impact of the disturbances created by stepping action, the ratio of times of stepping to dwell should be minimized. This can be accomplished by precise synchronization of the various processor elements.

The time of propagation of a signal in free space is about one nanosecond per foot and with typical antenna apertures of tens of feet, then transmission delays of tens of nanoseconds are possible. A pulse waveform for synchronization of the various processors to one or two nanoseconds will require a transmission path of several hundred megacycle bandwidth. A CW waveform however, occupies negligible bandwidth.

SUMMARY OF THE INVENTION

Accordingly it is a principal object of the present invention to provide an improved time reference clock distribution system.

A further object is to provide circuitry for distributing a time reference clock to all of the individual processors in an active aperture antenna array.

These and other objects of the present invention are achieved by a time reference or clock signal formed of two continuous wave sinusoidal waves of different frequency but of equal amplitude. The resulting composite waveform has sharply defined nulls occuring at the difference frequency which may be used as a precise time reference. By deriving the difference frequency from a stable clock source, the nulls in the composite waveform will be locked to the timing of the clock. Phase shift of one of the constituent sinusoidal waveforms relative to the other allows a vernier adjustment of the null to be set. A 180 degrees phase shift, for example, moves the null thru a time equal to one half of the null repetition interval.

DESCRIPTION OF THE PREFERRED EMBODIMENTS

Figure 1:
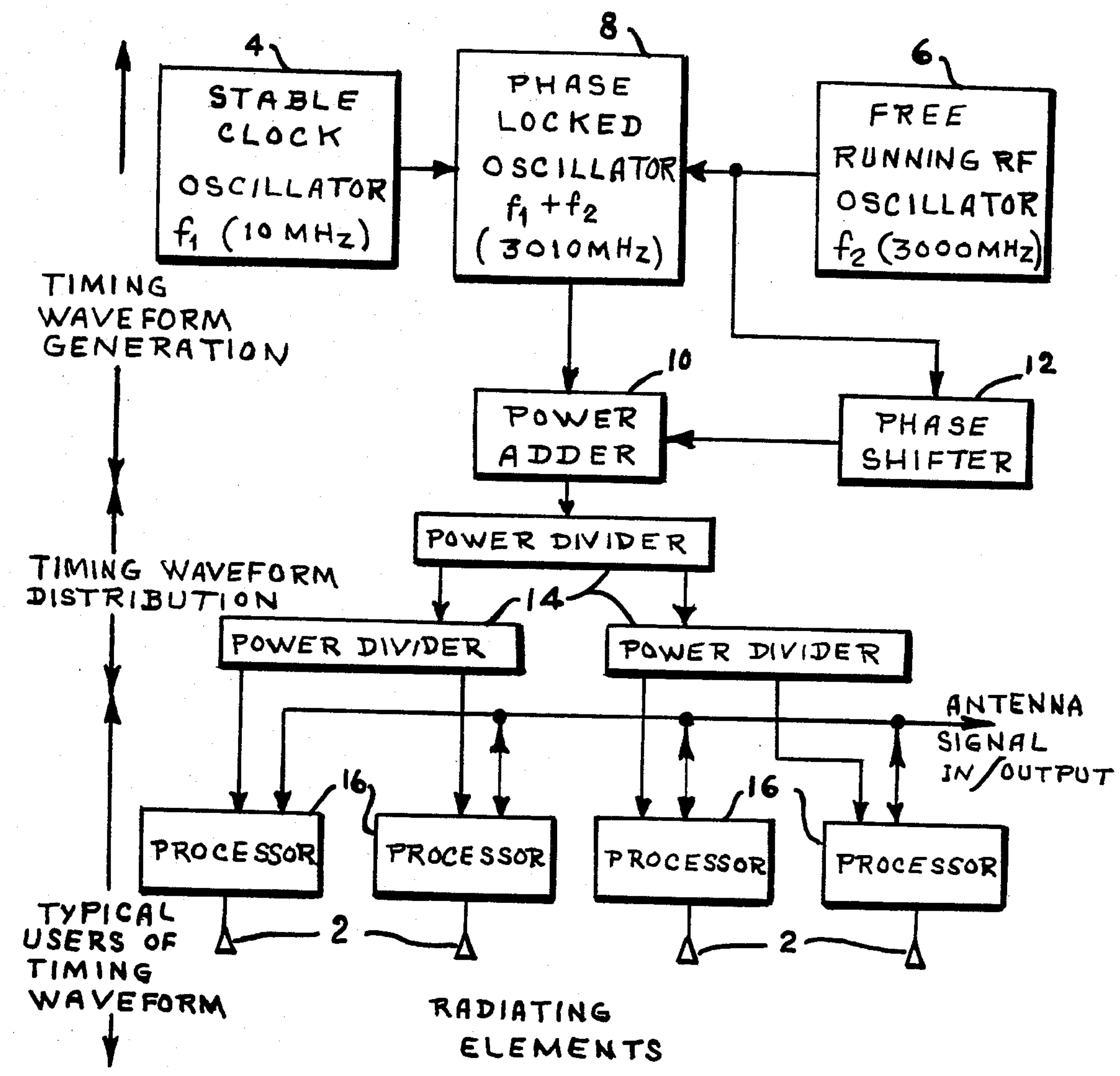
FIG. 1 is a block diagram of the clock distribution circuit of the present invention.

With reference to FIG. 1, the selected application of the present invention illustrates the distribution of a time reference clock to all the individual processors in an active aperture antenna array. To simplify the illustration, a one dimensional array of only four radiating/receiving elements 2 is shown. Two dimensional arrays with four thousand elements, however, are more typical of today's designs. The radiating elements 2 typically are spaced at several inch intervals, with the entire row of say 100 elements being many feet long.

The source of timing signals is represented in FIG. 1 by a stable clock oscillator 4. A frequency $f_1$ of 10 MHz is assigned here for illustrative purposes. An RF oscillator 6, having a frequency $f_2$ say of 3,000 MHz, provides one of the two signals to be used to distribute the time reference. A phase locked oscillator 8 is driven by the stable oscillator 4 and the RF oscillator 6 so that it is phase locked to the sum of these two frequencies, $f_1+f_2$, that is 3010 MHz. Outputs from the RF and phase locked oscillators are added in a power adder 10 to give equal contributions in the resulting composite, two frequency, sum signal. A phase shifter 12 is located in the path of one of the two frequencies, and shown here in the path of frequency $f_2$, permits vernier adjustment of the nulls in the sum signal relative to the phase of the stable clock oscillator 4. These relations can be expressed as follows:

Let stable oscillator 4 output be: $\sin(2\pi f_1 t+a)$

Let RF oscillator 6 output be: $\sin(2\pi f_2 t+b)$

Then phase locked oscillator 8 output is: $\sin(2\pi(f_1+f_2)t+a+b)$

And the composite time signal is: $2\sin(\pi(2f_2+f_1)t+(a+2b)/2)\cos(\pi f_1 t+a/2)$ where the cosine term represents the envelope of the waveform, with nulls at the frequency of stable oscillator 4. The time of the nulls can be modified by changing the value of phase "a" in the cosine term in the last equation.

The network for distributing this two frequency waveform is illustrated in FIG. 1 as a pyramid of power dividers 14 resulting in equal fractions of the power of the time reference signal being delivered to all processors 16. In the design of the active array antenna, a distribution system of this type must already exist to distribute signals for transmission or to collect them during reception. The timing waveform may use these existing RF signal distribution paths if it does not interfere with the signal waveforms. The segregation or filtering of the timing waveform is made easy by its characteristics that are its insensitivity to the RF frequency at which it is set and its spectrum being two pure frequencies with no splatter outside of these spot frequencies.

The waveform comprised of two equal amplitude frequencies disclosed above is preferred for its simplicity. However many phase locked frequencies also could be added and their relative amplitudes controlled to give timing waveforms that are somewhat improved on the one disclosed. For example the null could be made sharper and hence the timing more precise. Another alternate with multiple frequencies is to so phase them as to create a periodic spike which would have a similar sharp rise time to that of the null. This spike waveform may, in some instances, be more suitable to use as a trigger than the waveform with a periodic null. Other applications that might utilize the novel clock signal distribution system described above are two dimensional antenna arrays, seismic or sonar arrays, and distributed processing in general.

A variant on the vernier control of the time pulse by phase changing one of the two RF constituents has an interesting application to array processing. If a signal arrives at the array from an angle not normal to the plane of array, then a wavefront of the signal will arrive at different times across the array aperture. It is often desirable to synchronize the processing at the element to the arriving wavefront. However, since signal sources may come from any direction, it is very desirable to rapidly modify the timing to suit the direction of arrival of a particular signal.

Figure 2:
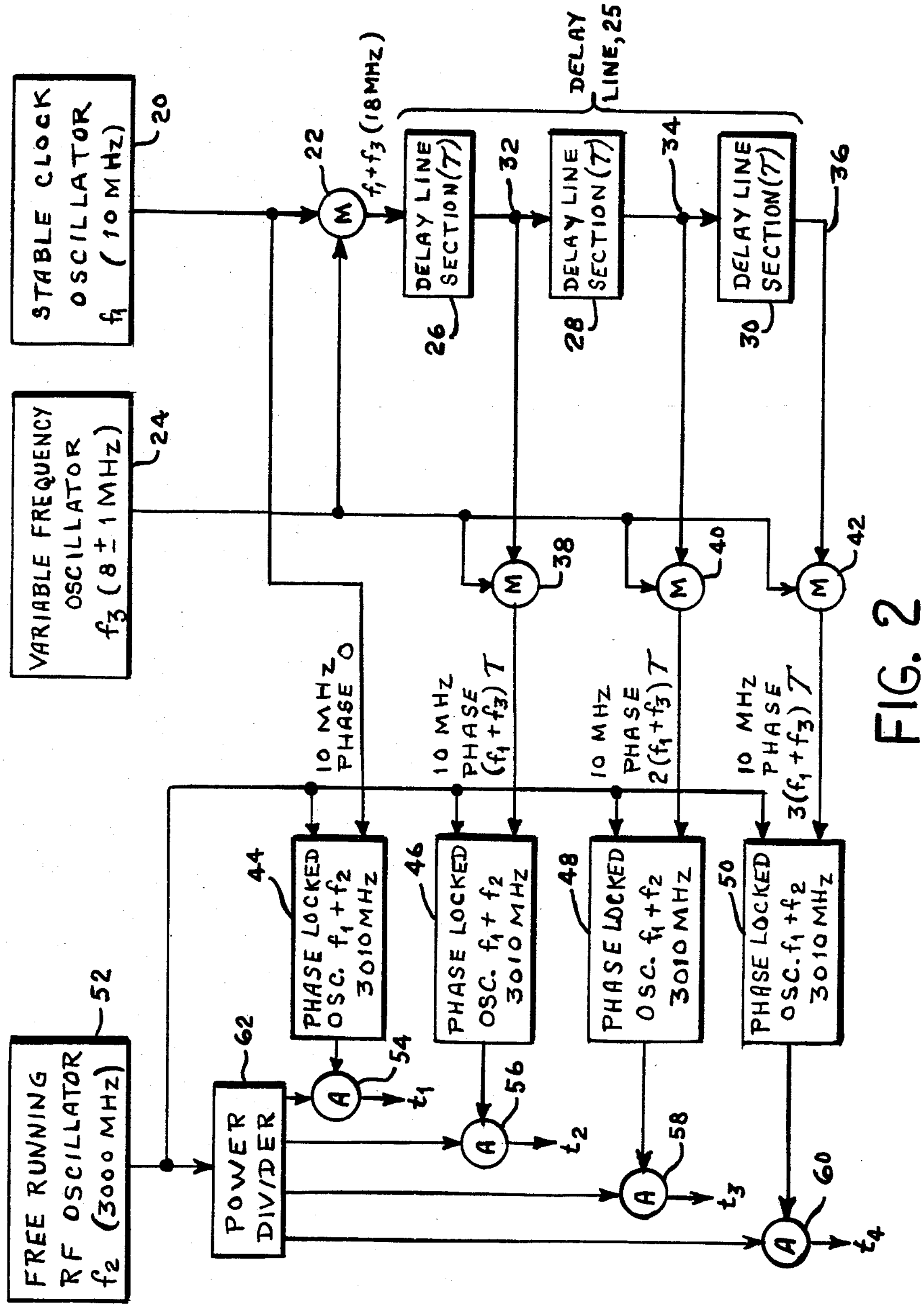
FIG. 2 is a block diagram of an alternate embodiment of the present invention including means for controlling the phase shift of the distributed timing signals.

FIG. 2 illustrates how a well known method of controlling phase shift may be utilized to obtain the desired vernier increments of time reference delay over the entire array, to precisely match the time of arrival of off-axis signals. The time reference signal $f_1$ derived from stable clock oscillator 20 is side stepped in frequency by mixing in a signal mixer 22 with a variable frequency $f_3$ generated by a variable frequency oscillator 24. The mixer 22 output signal $f_1+f_3$ is applied to a tapped delay line 25 consisting of delay line sections 26, 28 and 30. Output signals derived from taps 32, 34 and 36 of the delay line sections are mixed in mixers 38, 40 and 42 with the same variable frequency $f_3$ to recreate the frequency of the original time reference signal. However the phase carried by the reference signal $f_1$ at the inputs to the phase locked oscillators 44, 46, 48 and 50 now is advanced on that of the clock by an amount proportional to their respective time delays multiplied by offset frequency $f_3$. The output frequency $f_2$ of free running oscillator 52 forms the second input for each of the phase locked oscillators 44, 46, 48 and 50 whose outputs are in turn applied to power adders 54, 56, 58 and 60 respectively together with a portion of the signal formed by free running oscillator 52 and power divider 62. It can be seen that increasing the offset frequency $f_3$ advances all phases $t_1$, $t_2$, $t_3$ and $t_4$ of the reference signal in proportion to the delay encountered in the delay line sections.

Although the invention has been described with reference to a particular embodiment, it will be understood to those skilled in the art that the invention is capable of a variety of alternative embodiments within the spirit and scope of the appended claims.

What is claimed is:

1. A clock signal distribution system for synchronizing the operation of a plurality of separate digital processing elements having clock signal transmission paths of different lengths comprising:

a first oscillator providing a first output frequency $f_1$, a second oscillator providing a second output frequency $f_2$, a phase locked oscillator adapted to receive output frequency $f_1$ and output frequency $f_2$ from said first and second oscillators respectively to provide a single combined output frequency $f_1+f_2$, a power adder having first and second inputs and an output, means for coupling said single combined output frequency $f_1+f_2$ from said phase locked oscillator to said first input of said power adder, and means for coupling said output frequency $f_2$ from said second oscillator to said second input of said power adder, whereby a composite two-frequency clock signal is formed at the output of said power adder having sharply defined nulls occurring at the frequency $f_1$.

2. Apparatus as defined in claim 1 wherein said means for coupling said output frequency $f_2$ from said second oscillator to said second input of said power adder includes:

a phase shifter for providing a vernier adjustment of the time occurrence of the nulls in said composite two-frequency clock signal relative to said first oscillator output frequency $f_1$.

3. Apparatus as defined in claim 1 wherein said means for coupling said combined output frequency $f_1+f_2$ from said phase locked oscillator to said first input of said power adder includes:

a phase shifter for providing a vernier adjustment of the time occurrence of the nulls in said composite two-frequency clock signal relative to said first oscillator output frequency $f_1$.

4. Apparatus as defined in claim 2 and further comprising:

a plurality of digital processing elements, a power divider network having an input coupled to the output of said power adder and a plurality of outputs each coupled to one of said plurality of digital processing elements.

5. Apparatus as defined in claim 4 wherein said power adder provides equal contributions of said combined output frequency $f_1+f_2$ and said output frequency $f_2$ in said composite two-frequency clock signal.

6. Apparatus as defined in claim 1 and further comprising:

a third oscillator providing a variable third output frequency $f_3$, means for mixing output frequency $f_1$ and output frequency $f_3$ from said first and third oscillators respectively to provide a single combined output frequency $f_1+f_3$, delay line means coupled to said mixing means and having a plurality of output delay taps providing a like plurality of delayed output signals of frequency $f_1+f_3$, means for remixing each of said plurality of delayed output signals of frequency $f_1+f_3$ with said output frequency $f_3$ to form a plurality of phase shifted output signals of frequency $f_1$, a plurality of additional phase lock oscillators each receiving output frequency $f_2$ and one of said plurality of phase shifted output signals of frequency $f_1$ to provide a plurality of phase shifted output frequencies $f_1+f_2$, and a plurality of additional power adders each receiving an output frequency $f_1+f_2$ from one of said plurality of additional phase locked oscillators and output frequency $f_2$ to provide a plurality of composite two-frequency clock signals having sharply defined nulls occurring at selected phases of the frequency $f_1$.

* * * * *